Aug. 7, 1956 N. E. LINDENBLAD 2,758,146
THERMOELECTRIC ELEMENTS AND MATERIALS
Filed Oct. 1, 1954
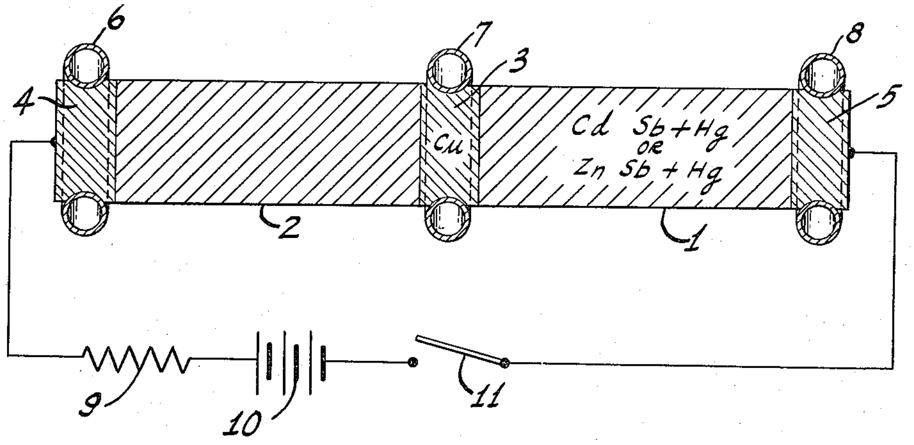
INVENTOR.
NILS E. LINDENBLAD
BY J. L. Whittaker
ATTORNEY United States Patent Office 2,758,146

Patented Aug. 7, 1956

2,758,146

THERMOELECTRIC ELEMENTS AND MATERIALS

Nils E. Lindenblad, Princeton, N. J., assignor to Radio Corporation of America, a corporation of Delaware Application October 1, 1954, Serial No. 459,773

10 Claims. (Cl. 136—5)

This invention relates to improved thermoelectric elements and more particularly to such elements useful in thermoelectric devices comprising single or multiple junctions between different metals. Such elements used as part of an electric circuit generate an electric current when the junction has a temperature different from the rest of the circuit, or they generate heat or cold at the junction when a current of one or the other direction is passed through the circuit.

One object of the instant invention is to provide improved thermoelectric elements and materials of greater effective thermoelectric powers than heretofore obtainable.

Another object is to provide improved thermoelectric devices capable of producing a greater reduction in temperature than heretofore possible.

The intermetallic compounds CdSb and ZnSb are known to have exceptionally high thermoelectric E. M. F.'s, CdSb being somewhat better than ZnSb in this regard. The resistivity of pure CdSb, however, is so high that its realizable, or effective thermoelectric power ($e'$) is inferior to the $e'$ of ZnSb and of other known thermoelectric materials. It is known that much improved effective thermoelectric powers may be realized in CdSb that departs by a small proportion, up to about 2%, from perfect stoichiometry. It has also been suggested that similar, improved results may be obtained by including up to about 2% of a metal of the VIIIth column of the periodic table as an impurity in CdSb. The effect of the departure from stoichiometry or of the impurity inclusion is to provide a substantial reduction in the resistivity of the CdSb accompanied by only a relatively small reduction in its thermoelectric E. M. F. thereby increasing its $e'$. Collateral advantages are also sometimes apparent relating to the physical strength of the alloys and to the ease of preparing them. In the case of ZnSb similar treatments have been found to provide very little, if any, thermoelectric improvement and are resorted to principally because of their collateral benefits.

According to the instant invention it has now been discovered that alloying mercury into CdSb and into ZnSb increases the effective thermoelectric powers of these compounds. Optimum results are achieved according to the invention when mercury is added to CdSb which already departs slightly from perfect stoichiometry. The $e'$ of ZnSb is maximized when mercury is added to the pure compound. In view of the phase relationships involved in cooling molten ZnSb, however, it is sometimes preferable to utilize non-stoichiometric ZnSb, the degree of departure from perfect stoichiometry being determined principally by individual metallurgical procedures. The mercury not only decreases the resistivities of the materials but also increases their thermoelectric E. M. F.'s, thus greatly improving their effective thermoelectric powers. Collateral benefits are also provided in that the preparation of the alloys is facilitated and their physical strength improved.

The invention will be described in greater detail with reference to the accompanying drawing of which the single figure is a schematic, cross-sectional, elevational view of a thermoelectric element according to the invention.

The element is composed of two thermoelectrically differential members 1 and 2 which are conductively joined by an intermediate conductive part 3 of slight or negligible thermoelectric power. The member 1 consists of CdSb alloyed with about 0.5 to 2 wgt. per cent of Sb or Cd and about 2.5 wgt. per cent mercury. The member 2 may consist of any desired thermoelectric composition complementary to CdSb such as, for example, lead telluride. The intermediate part 3 which connects the differential members to form a thermoelectric junction between them consists preferably of copper. It serves as a terminal for the generated cold and may be contacted by a pipe coil 7 to conduct a fluid coolant to a distant location. Alternatively, the member may be shaped as a thin vane or other structure for cooling only in its immediate environment.

An energizing circuit comprising a current source 10, a resistor 9 and a control switch 11 is connected to the element through copper end terminals 4 and 5. The end terminals are provided with single turn pipe coils 6 and 8 through which a heat transporting fluid may be pumped to maintain them at a relatively constant temperature. Thus, when the action of the current through the thermoelectric junction produces a temperature differential between the intermediate terminal 3 and the end terminals, the end terminals may be maintained at a constant temperature and the intermediate one may be reduced in temperature.

The compositions according to the instant invention are of the so-called p-type thermoelectric class, i. e., when they are connected in an electric circuit an applied potential will produce heating at the electrically negative connection and cooling at the positive connection.

A preferred embodiment of the invention comprises CdSb alloyed with 2 wgt. per cent Sb and 2.5 wgt. per cent Hg. This alloy in thermoelectric junction with lead, a neutral material, has an effective thermoelectric power ($e'$) of about 130 microvolts as compared with a thermoelectric power of about 110 microvolts obtainable with an alloy of CdSb and 2 wgt. per cent Sb without mercury. The mercury-containing alloy exhibits a substantially lower electrical resistance than the mercury-free alloy.

A corresponding alloy may be made of ZnSb with or without an excess of Sb but including 2.5 wgt. per cent Hg. This alloy has a thermoelectric power of about 115 as compared with a thermoelectric power of about 95 for the simple ZnSb alloy. In this case also the mercury appreciably lowers the resistance of the composition.

The optimum range of mercury concentration in the alloys according to the invention is about 2 to 2.5 wgt. per cent. Mercury, however, even in minute proportions is beneficial to these alloys. Increasing the mercury concentration above about 2.5 wgt. per cent appears to provide but little additional improvement in the thermoelectric properties of the alloy. Concentrations of mercury above about 5%, however, cause the alloys to become brittle and fragile and are, therefore, not recommended.

In certain instances, for reasons which are not presently clear, the addition of even 2 to 2.5 wgt. per cent of mercury tends to embrittle the alloys and to cause CdSb to adhere to ordinary crucible materials such as glass or quartz. If desired, a small amount, up to about 1 to 1.5% of thallium may also be added to the compositions to minimize the embrittlement and sticking.

Thallium in restricted quantities does not adversely affect the thermoelectric properties of the materials.

The compositions that are improved by the addition of mercury according to the invention are ZnSb and CdSb, the latter preferably alloyed with a small proportion of one of its constituents so that it is in a slightly impure state. The limits of the deviation from stoichiometry of these compounds are not critical features of the instant invention. In general, however, optimum results may be achieved by adding mercury to the basic compositions having the best thermoelectric properties. The preferred basic compositions are (*a*) ZnSb and (*b*) CdSb alloyed with about 2 wgt. per cent of Sb. Other satisfactory compositions are ZnSb and CdSb either in pure form or alloyed with up to about 4% of either one of their respective constituents.

There have thus been described improved thermoelectric elements of novel compositions which possess exceptionally high thermoelectric powers.

What is claimed is:

1. A thermoelectric alloy consisting essentially of a compound selected from the group consisting of CdSb and ZnSb, said compound being within 2 wgt. per cent of perfect stoichiometry and being alloyed with up to 5 wgt. per cent mercury and 0 to 1.5 wgt. per cent thallium.

2. A thermoelectric alloy consisting essentially of an alloy of CdSb and mercury, said mercury being present in a proportion up to 5 wgt. per cent based on the weight of said CdSb, and said CdSb being within 2 wgt. per cent of perfect stoichiometry.

3. A thermoelectric alloy consisting essentially of an alloy of CdSb and mercury, said mercury being present in the proportion of 2 to 2.5 wgt. per cent based on the total weight of said CdSb, and said CdSb having an intermolecular ratio within 2 wgt. per cent of its theoretical formula.

4. A thermoelectric alloy consisting essentially of an alloy of CdSb, mercury and thallium, said mercury being present in a proportion up to about 5 wgt. per cent and said thallium being present in a proportion up to about 1.5 wgt. per cent, both based on the weight of said CdSb, the antimony content of said CdSb being within 2 wgt. per cent of the quantity of antimony required to form a stoichiometrically perfect compound.

5. A thermoelectric alloy consisting essentially of an alloy of ZnSb and mercury, said mercury being present in a proportion up to 5 wgt. per cent based on the weight of said ZnSb, and said ZnSb being within 2 wgt. per cent of perfect stoichiometry.

6. A thermoelectric alloy consisting essentially of an alloy of ZnSb and mercury, said mercury being present in the proportion of 2 to 2.5 wgt. per cent based on the total weight of said ZnSb, and said ZnSb having an intermolecular ratio within 2 wgt. per cent of its theoretical formula.

7. A thermoelectric alloy consisting essentially of an alloy of ZnSb, mercury and thallium, said mercury being present in a proportion up to about 5 wgt. per cent and said thallium being present in a proportion up to about 1.5 wgt. per cent, both based on the weight of said ZnSb, the antimony content of said ZnSb being within 2 wgt. per cent of the quantity of antimony required to form a stoichiometrically perfect compound.

8. A thermoelectric element comprising two circuit members of thermoelectrically complementary materials, said members being conductively joined to form a thermoelectric junction, at least one of said two members consisting of an alloy of a compound selected from the group consisting of CdSb and ZnSb, said compound being within 2 wgt. per cent of perfect stoichiometry and being alloyed with up to 5 wgt. per cent mercury and 0 to 1.5 wgt. per cent thallium.

9. A thermoelectric element comprising two circuit members of mutually complementary thermoelectric materials, a heat absorbing element of good conductivity conductively joined intermediate said thermoelectric members to form together therewith a thermoelectric junction, one of said thermoelectric members consisting essentially of an alloy of stoichiometrically imperfect CdSb and mercury, said mercury being present in the proportion of 2 to 2.5 wgt. per cent based on the weight of said CdSb, and said CdSb being within 2 wgt. per cent of perfect stoichiometry.

10. A thermoelectric element according to claim 9 in which said alloy also includes thallium in a proportion of up to 1.5 wgt. per cent based on the weight of said CdSb.

References Cited in the file of this patent

UNITED STATES PATENTS

| | | |
|---|---|---|
| 51,442 | Farmer | Dec. 12, 1865 |
| 425,568 | Edelkamp | Apr. 15, 1890 |
| 1,934,875 | Nicodemo | June 4, 1931 |
| 2,685,608 | Justi | Aug. 3, 1954 |

FOREIGN PATENTS

| | | |
|---|---|---|
| 402,117 | Great Britain | Nov. 27, 1933 |